(12) United States Patent
Wang

(10) Patent No.: US 10,780,553 B2
(45) Date of Patent: Sep. 22, 2020

(54) VACUUM ADSORBING WORKBENCH AND VACUUM ADSORBING DEVICE

(71) Applicant: BOE TECHNOLOGY GROUP CO., LTD., Beijing (CN)

(72) Inventor: Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 220 days.

(21) Appl. No.: 15/981,884

(22) Filed: May 16, 2018

(65) Prior Publication Data

US 2019/0015955 A1 Jan. 17, 2019

(30) Foreign Application Priority Data

Jul. 14, 2017 (CN) .......................... 2017 1 0577344

(51) Int. Cl.
| | | |
|---|---|---|
| *B25B 11/00* | (2006.01) | |
| *B25B 11/02* | (2006.01) | |
| *B25J 15/06* | (2006.01) | |
| *B26D 7/01* | (2006.01) | |
| *H01L 21/683* | (2006.01) | |
| *B23Q 3/08* | (2006.01) | |

(52) U.S. Cl.
CPC ............ *B25B 11/005* (2013.01); *B25B 11/02* (2013.01); *B23Q 3/08* (2013.01); *B25J 15/06* (2013.01); *B26D 7/018* (2013.01); *H01L 21/6838* (2013.01)

(58) Field of Classification Search
CPC .. B23Q 3/00; B23Q 3/08; B23Q 3/088; B25B 11/00; B25B 11/01; B25B 11/005; B26D 7/018; B25J 15/06; B25J 15/016–0691; H01L 21/6838

USPC ......................................................... 269/21
See application file for complete search history.

(56) References Cited

U.S. PATENT DOCUMENTS

| | | | | |
|---|---|---|---|---|
| 3,652,075 A | * | 3/1972 | Thompson ............ | B25B 11/005 269/21 |
| 4,205,835 A | * | 6/1980 | Gerber .................... | A41H 15/00 269/21 |
| 5,038,486 A | * | 8/1991 | Ducate, Sr. ............. | B27B 25/10 33/430 |
| 2002/0140149 A1 | | 10/2002 | Kimble | |

(Continued)

FOREIGN PATENT DOCUMENTS

| | | | | |
|---|---|---|---|---|
| CN | 105583749 | * | 5/2016 | ............ B25B 11/00 |
| CN | 105583749 A | | 5/2016 | |
| CN | 205521462 U | | 8/2016 | |

(Continued)

OTHER PUBLICATIONS

First Chinese Office Action dated Aug. 28, 2018, for corresponding Chinese Application No. 201710577344.2.

*Primary Examiner* — Orlando E Aviles
*Assistant Examiner* — Robert F Neibaur
(74) *Attorney, Agent, or Firm* — Kinney & Lange, P.A.

(57) ABSTRACT

A vacuum adsorbing workbench and a vacuum adsorbing device are provided. The vacuum adsorbing workbench includes a workbench body, a first suction tube and an occluder. The workbench body is provided with multiple suction holes. Each suction hole is in communication with the first suction tube. The occluder is able to be connected with the first suction tube cooperatively to cut off communication between each suction hole and the first suction tube.

20 Claims, 2 Drawing Sheets

(56) References Cited

U.S. PATENT DOCUMENTS

2012/0311848 A1* 12/2012 Park .................. H01L 21/6838
                                                          29/559
2019/0221467 A1*  7/2019 Scholz-Goerlach ........................
                                                       H01L 21/68785

FOREIGN PATENT DOCUMENTS

| CN | 106346390 A | 1/2017 |
| KR | 20160102907 A | 8/2016 |

* cited by examiner

VACUUM ADSORBING WORKBENCH AND VACUUM ADSORBING DEVICE

CROSS-REFERENCE TO RELATED APPLICATION

The present application claims a priority to Chinese Patent Application No. 201710577344.2 filed on Jul. 14, 2017, the disclosure of which is incorporated in its entirety by reference herein.

TECHNICAL FIELD

The present disclosure relates to the technical field of vacuum devices, and more particularly, to a vacuum adsorbing workbench and a vacuum adsorbing device.

BACKGROUND

It is necessary to utilize a vacuum adsorbing workbench in various processes for manufacturing panels, such as substrate cutting, panel bonding and attaching a film onto a panel surface. A panel is fixed onto the workbench by a vacuumizing device, and then subjected to subsequent processes.

SUMMARY

In a first aspect, the present disclosure provides a vacuum adsorbing workbench, including a workbench body, a first suction tube and an occluder. The workbench body is provided with a plurality of suction holes. Each of the plurality of suction holes is in communication with the first suction tube. The occluder is configured to be connected with the first suction tube cooperatively to cut off a communication between each of the plurality of suction holes and the first suction tube.

In a second aspect, the present disclosure further provides vacuum adsorbing device, including the vacuum adsorbing workbench in the first aspect and a vacuumizing device. The vacuumizing device is in communication with a second suction tube of the vacuum adsorbing workbench.

In compassion with the related technology, in the vacuum adsorbing workbench and the vacuum adsorbing device provided in embodiments of the present disclosure, the workbench body is provided with the plurality of suction holes and each suction hole is in communication with the first suction tube. When a to-be-adsorbed object is placed on the workbench body, the to-be-adsorbed object is adsorbed onto the workbench body via the first suction tube and the suction holes. For the suction hole(s) on the workbench body not covered by the to-be-adsorbed object, the occluder is inserted into the first suction tube to cut off connection(s) between the suction hole(s) not covered by the to-be-adsorbed object and the first suction tube.

BRIEF DESCRIPTION OF THE DRAWINGS

For better clarifying technical solutions in embodiments of the present disclosure or related technologies, drawings to be used in descriptions on the embodiments or related technologies are briefly introduced hereinafter. Apparently, the described drawings are merely for a part of embodiments of the present disclosure, and the ordinary skilled in the art can obtain other drawings based on those described drawings without paying inventive efforts.

DETAILED DESCRIPTION

Technical solutions in embodiments of the present disclosure are to be described hereinafter in a clear and complete way in conjunction with drawings in the embodiments of the present disclosure. Apparently, embodiments described herein are only a part of, rather than all of, embodiments of the present disclosure. All other embodiments obtained by the ordinary skilled in the art based on the embodiments in the present disclosure without creative efforts fall within protection scope of the present disclosure.

It should be understood that orientations or position relationships indicated by terms such as "center", "up", "down", "front", "rear", "left", "right", "vertical", "horizontal", "top", "bottom", "inside" and "outside" are orientations or position relationships illustrated in drawings. Those terms are merely to describe the present disclosure conveniently and simply, rather than to indicate or imply that a corresponding device or element needs to have a particular orientation or needs to be constructed and operate with a particular orientation. Thus, those terms should not be understood as limitations for the present disclosure.

In related technology, in a case that panels having various sizes utilize vacuum adsorbing workbenches having a same size, an undersize panel may cause partial suction holes on a workbench which are not covered by the panel to be in communication with the external, which results in an air leakage phenomenon of the workbench; in addition, an oversize panel cannot be completely fixed onto the workbench. Hence, vacuum adsorbing workbenches of different sizes need to be utilized for panels of different sizes. However, changing the vacuum adsorbing workbench frequently increases time spent in device debugging and decreases working efficiency in panel processing.

Figure 1:
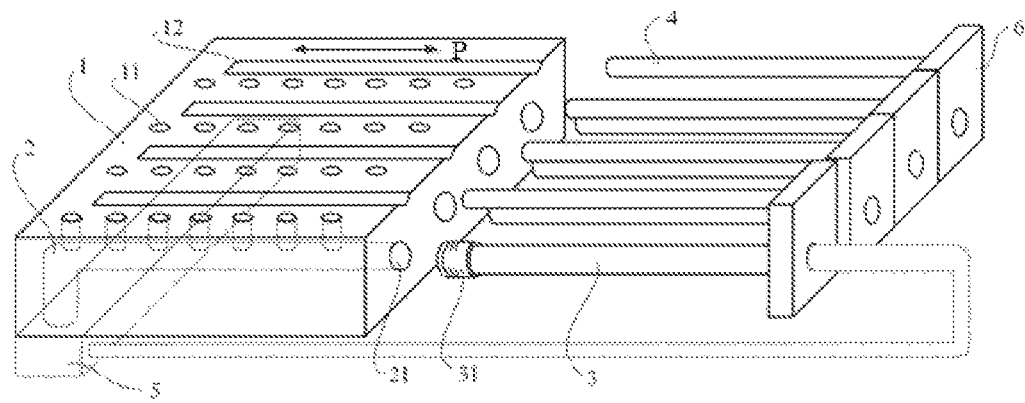
FIG. 1 is a schematic structural diagram of a vacuum adsorbing workbench according to some embodiments of the present disclosure.
Figure 2:
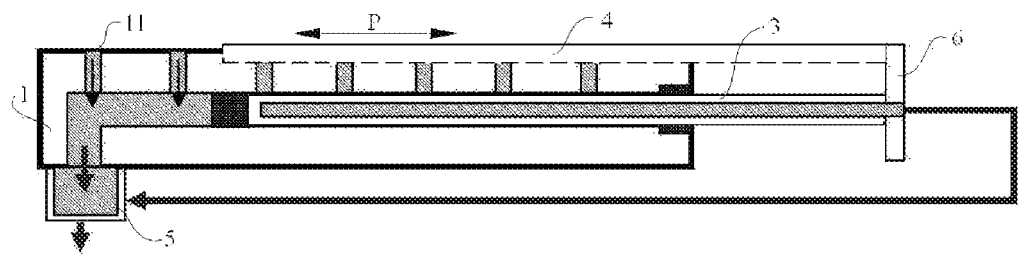
FIG. 2 is a schematic sectional view of the vacuum adsorbing workbench in FIG. 1 taken along a first direction P.
Figure 3:
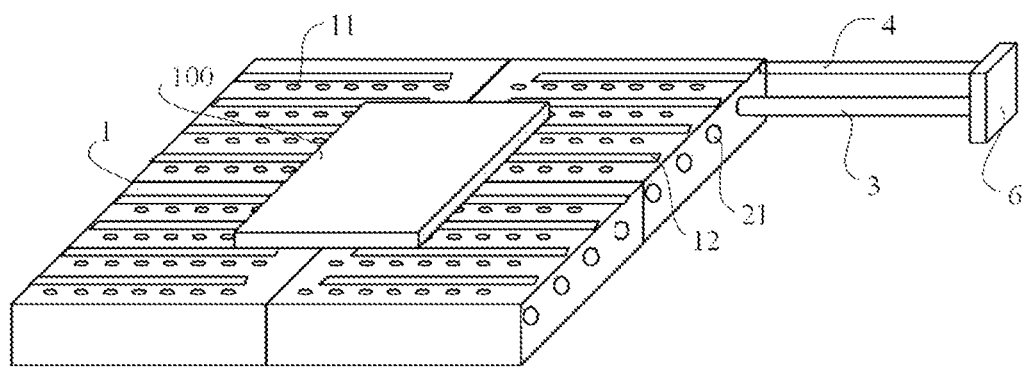
FIG. 3 is a schematic structural diagram of a vacuum adsorbing workbench on which a to-be-adsorbed object is placed according to some embodiments of the present disclosure.

With reference to FIG. 1 to FIG. 3, a vacuum adsorbing workbench according to some embodiments of the present disclosure includes a workbench body 1, a first suction tube 2 and an occluder 3. Multiple suction holes 11 are arranged in the workbench body 1 and each of the multiple suction holes 11 is in communication with the first suction tube 2. The occluder 3 may be connected with the first suction tube 2 cooperatively to cut off a communication between each suction hole 11 and the first suction tube 2.

In compassion with the related technology, in the vacuum adsorbing workbench provided in the embodiments of the present disclosure, the workbench body 1 is provided with the multiple suction holes 11, and each suction hole 11 is in communication with the first suction tube 2. When a to-be-adsorbed object 100 is placed on the workbench body 1, the first suction tube 2 adsorbs the to-be-adsorbed object 100 onto the workbench body 1 via the suction holes 11. For the suction hole(s) 11 on the workbench body 1 not covered by the to-be-adsorbed object 100, the occluder 3 is inserted into the first suction tube 2 to cut off connection(s) between the suction hole(s) not covered by the to-be-adsorbed object 100 and the first suction tube 2, thereby preventing the vacuum adsorbing workbench from generating air leakage. In the vacuum adsorbing workbench in the embodiments of the present disclosure, an insertion depth of the occluder 3 inside the first suction tube 2 can be adjusted to fix to-be-adsorbed objects 100 of different sizes. In this way, one vacuum adsorbing workbench can be utilized for to-be-adsorbed objects of different sizes, and there is no need to replace the vacuum adsorbing workbench, thereby reducing time spent in device debugging and improving working efficiency.

The to-be-adsorbed object 100 may be a to-be-processed substrate or panel.

Optionally, the multiple suction holes 11 may be distributed randomly in a way that when a part of the first suction tube 2 is occluded, communication between the first suction tube 2 and other suctions holes 11 may not be affected. In such a distribution manner, structure design for the first suction tube 2 is of relatively high difficulty. In the embodiments of the present disclosure, the suction holes 11 are arranged in an array, suction holes 11 in a same row are in communication with each other, while suction holes 11 in different rows are not in communication with each other. Accordingly, a quantity of the first suction tube 2 is equal to a quantity of rows of the suction holes 11, each first suction tube 2 is in communication with a corresponding row of suction holes 11 and is not in communication with the suction holes in other rows. Similarly, a quantity of the occluder 3 is equal to the quantity of rows of the suction holes 11, multiple occluders 3 may be cooperatively connected with multiple first suction tube 2 respectively in a one-to-one correspondence, and each occluder 3 can occlude a part of or all of the suction holes 11 in one row to cut off communication between the part of or all of the suctions holes in the row and the first suction tube 2. In such a distribution manner, the first suction tube 2 has a relatively simple structure.

The first suction tube 2 is provided with multiple air inlets, an air outlet and an opening 21. The multiple air inlets are arranged at a tube wall of the first suction tube 2 and are in communication with the multiple suction holes 11 in a one-to-one correspondence. The air outlet is located at one end of the first suction tube 2, and the opening 21 is located at the other end of the first suction tube 2. The air outlet is in communication with a vacuumizing device, and the occluder 3 may be conveniently inserted into the first suction tube 2 via the opening 21.

When using the vacuum adsorbing workbench, a to-be-adsorbed object 100 is placed along a first side of the workbench body 1, the occluder is inserted into the first suction tube 2 via the opening 21 to occlude the suction hole(s) not covered by the to-be-adsorbed object 100. The first side is opposite to a side of the workbench body 1 where the opening 21 is arranged.

A row direction of the suction holes 11 may be in parallel with an extending direction of the first suction tube 2 or not. If the row direction of the suction holes 11 is not in parallel with the extending direction of the first suction tube 2, the first suction tube 2 may include a bending structure, the first suction tube 2 may be relatively long and the occluder 3 is hard to be inserted at the bending structure. Optionally, if the row direction of the suction holes 11 is not in parallel with the extending direction of the first suction tube 2, the suction holes 11 may be arranged inclinedly with respect to the adjacent first suction tube 2 to be in communication with the adjacent first suction tube 2 when forming the suction holes in a direction perpendicular to the workbench body toward the interior of the workbench body, which makes the suction holes more difficult to be processed.

Reference can be made to FIG. 2, which is a schematic sectional view of the vacuum adsorbing workbench in FIG. 1 taken along a first direction P. A row direction of suction holes 11 arranged in an array is in parallel with the first direction P. In FIG. 2, vertical arrows pointing downwardly indicate an air sucking direction, the extending direction of the first suction tube 2 is in parallel with the first direction P, that is, the row direction of the suction holes 11 is to the sane as the extending direction of the first suction tube 2. The occluder 3 may be designed into an occluding rod whose length direction is in parallel with the extending direction of the first suction tube 2, and the occluding rod is able to slide inside the first suction tube 2. The occluding rod may be easily inserted into the first suction tube 2 via the opening 21, and the first suction tube 2 is a straight tube having a simple structure. According to some optional embodiments, the multiple suction holes 11 may be arranged in other ways as long as the multiple suction holes can be in communication with the suction tube.

In some optional embodiments, the suction holes 11 are arranged at an upper surface of the workbench body 1 in a direction perpendicular to the workbench body 1 and toward the interior of the workbench body 1, and the first suction tube 2 is arranged below the suction holes 11 correspondingly. Optionally, the extending direction of the first suction tube 2 is in parallel with the upper surface of the workbench body 1.

The insertion depth of the occluder 3 into the first suction tube 2 can only be obtained by observing whether the suction holes 11 are occluded. However, the suction holes are relatively deep and it is hard to observe whether the suction holes 11 are occluded, so it is not easy to control a position where the occluder 3 inserted into the first suction tube 2 reaches. In view of this, in some optional embodiments of the present disclosure, the occluder 3 is fixedly connected with a position limiting piece 4, and the position limiting piece 4 is located on the workbench body 1. A length direction of the position limiting piece 4 is in parallel with a length direction of the occluder 3, and a length of the position limiting piece 4 is the same as a length of the occluder 3. The position limiting piece 4 is able to slide, along its length direction, on the upper surface of the workbench body 1, and is able to slide to a position where the position limiting piece 4 abuts an edge of the to-be-adsorbed object 100. Since the occluder 3 is fixedly connected with the position limiting piece 4, the occluder 3 stops moving in the first suction tube 2 when the position limiting piece 4 slides to the position where the position limiting piece 4 abuts the edge of the to-be-adsorbed object 100 and stops sliding, hence, an occluding position of the occluder 3 is limited. Since the position limiting piece 4 and the occluder 3 have the same length, both the position limiting piece 4 and the occluder 3 stop at positions corresponding to the edge of the to-be-adsorbed object 100. Therefore, with the position limiting piece 4, it is convenient to control the occluder 3 to be inserted into the first suction tube 2 at an appropriate position, and the occluding process is relatively simple.

In some optional embodiments, the position limiting piece 4 is a position limiting rod. A length direction of the position limiting rod 4 may be in parallel with the first direction P. The upper surface of the workbench body 1 is provided with multiple guiding grooves 12. Each guiding groove 12 is located between two adjacent rows of suction holes 11, or located between an outmost row of suction holes and an outer edge of the workbench body 1. When the occluder 3 is inserted into the first suction tube 2, the position limiting rod 4 is cooperatively inserted into the guiding groove 12, and the position limiting rod moves along an extending direction of the guiding groove 12 as the occluder moves.

Furthermore, multiple first suction tubes 2 are respectively in communication with a vacuumizing device, which results in a complicated suction tube structure. In view of this, a vacuumizing adsorbing platform in some embodiments of the present disclosure further includes a second suction tube 5. The second suction tube 5 is in communication with the vacuumizing device and air outlets of the multiple first suction tubes 2 are respectively in communication with the second suction tube 5. The multiple first suction tubes 2 do not need to directly communicate with the vacuumizing device. The first suction tubes 2 may be designed relatively short, and the multiple short first suction tubes 2 and the second suction tube 5 form a relatively simple-structured suction tube.

In some optional embodiments, first suction tube 2 and the second suction tube 5 both have an L shape, and the first suction tube 2 and the second suction tube 5 are connected to form a U shape. The first suction tube 2 and the second suction tube 5 may be designed into other shapes according to design requirements for the workbench, which are not limited herein.

When the vacuumizing device generates a strong suction, a difference between pressures at two sides of the occluding rod is relatively large, and the occluding rod moves under a force caused due to the difference between pressures. For example, the occluding rod moves into the first suction tube 2 under the to-be-adsorbed object 100 and cuts off communication between the suction holes 11 and the first suction tube 2 under the to-be-adsorbed object 100, thus, the to-be-adsorbed object 100 cannot be fixed reliably. In view of the above, according to an embodiment of the present disclosure, the occluding rod is a hollow structure and is in communication with the second suction tube 5. Pressures at two sides of the occluding rod cooperating with the first suction rod 2 are the same, so forces there are the same, the occluding rod can stably stay at any position in the first suction tube 2 and may not be sucked into the first suction tube 2. In addition, the second suction tube 5 according to the embodiments of the present disclosure is located below the workbench body 1, and the occluding rod is in communication with the second suction tube 5 via an external tube.

In some optional embodiments, in order to enhance airtightness of the occluding rod, a sealing ring 31 is sleeved on the end of the occluding rod cooperating with the first suction tube 2. Hence, the airtightness at the end of the occluding rod cooperating with the first suction tube 2 is enhanced, and the occluding rod is further prevented from being sucked into the first suction tube 2.

Optionally, the first suction tube 2 may be arranged below the workbench body 1 or may be arranged inside the workbench body 1. According to some optional embodiments of the present disclosure, the first suction tube 2 is arranged in the workbench body 1 and located below the suction holes 11, such that the suction holes can be in communication with the first suction tube 2 conveniently.

Accordingly, the opening 21 is located at a lateral side of the workbench body 1 perpendicular to the row direction of the suction holes.

The position limiting piece 4 and the occluder 3 may be fixedly connected either in a direct manner or in an indirect manner. In some optional embodiments, as shown in FIG. 3, a vacuum adsorbing platform further includes a fixation plate 6 via which the position limiting piece and the occluder 3 are fixedly connected. The fixation plate 6 may be fixedly connected to both the position limiting piece and the occluder via screws, and may be detached from the position limiting piece and the occluder by loosening the screws. Hence, assembling and disassembling of an occluding assembly formed by the position limiting piece 4, the occluder 3 and the fixation plate 6 are relatively convenient.

The vacuum adsorbing platform may be formed by a plurality of the above-described workbench bodies 1. An appropriate vacuum adsorbing platform may be assembled according to lengths and widths of to-be-adsorbed objects having different shapes. By assembling multiple workbench bodies, the vacuum adsorbing platform can be applied to to-be-adsorbed objects having different sizes.

Figure 4:
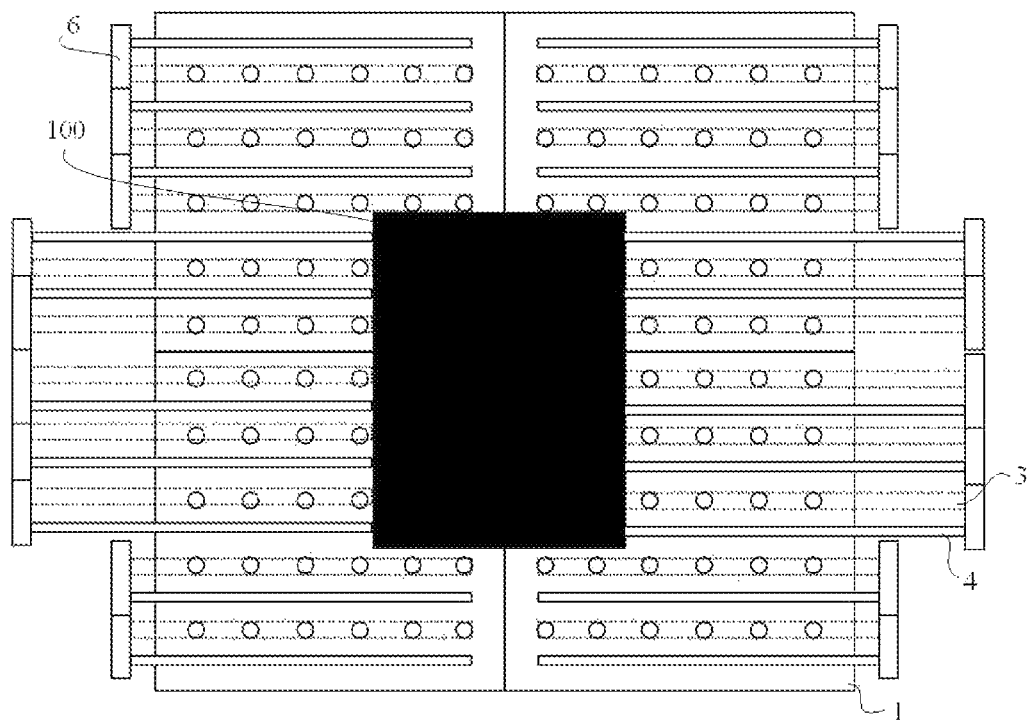
FIG. 4 is a schematic structural diagram of a vacuum adsorbing workbench on which a to-be-adsorbed object is placed according to some embodiments of the present disclosure.

As shown in FIG. 3 and FIG. 4, a vacuum adsorbing platform according to some embodiments of the present disclosure includes four workbench bodies 1. During assembling, a lateral side having the opening 21 of each workbench body 1 is located at an exterior of a combinatorial platform, such that the occluder 3 can be easily inserted into the first suction tube 2 via the opening 21. The position limiting rod 4 and the occluding rod 3 form an occluding assembly via the fixation plate 6. In application, in each occluding assembly for two upper workbench bodies 1 in FIG. 4, the position limiting rod is located above the occluding rod; and in each occluding assembly for two lower workbench bodies 1 in FIG. 4, the occluding rod is located above the position limiting rod.

Figure 5:
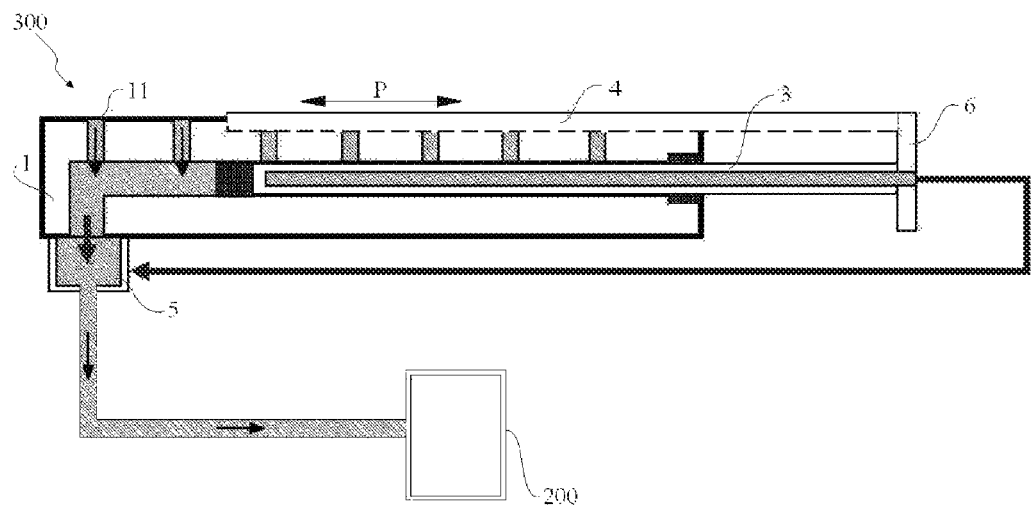
FIG. 5 is a schematic structural diagram of a vacuum adsorbing device according to some embodiments of the present disclosure.

Some embodiments of the present disclosure further provide a vacuum adsorbing device 300, including any above-described vacuum adsorbing workbench and a vacuumizing device 200. As shown in FIG. 5, the vacuumizing device 200 is in communication with the second suction tube 5 of the vacuum adsorbing workbench. The vacuum adsorbing workbench installed in the vacuum adsorbing device according to the embodiment has a same structure with the vacuum adsorbing workbench according to any foregoing embodiments, the vacuum adsorbing workbench according to the embodiment can solve a same technical problem and achieve a same expected result to that according to any foregoing embodiment.

A work flow of the vacuum adsorbing device 300 according to the embodiments of the present disclosure is described as follows. The to-be-adsorbed object 100 is placed on the workbench body 1, the occluding assembly is pushed towards the to-be-adsorbed object 100 until the position limiting rod abuts the to-be-adsorbed object 100. For a whole row of suction holes 11 not covered by the to-be-adsorbed object 100, the occluder 3 is pushed into the first suction tube 2 until an inner surface of the fixation plate 6 abuts a lateral side of the workbench body. The vacuumizing device 200 is turned on to vacuumize the first suction tube 2 such that the to-be-adsorbed object 100 can be fixed onto the workbench body 1 in a way of vacuum.

Optional embodiments of the present disclosure are described hereinabove, but the protection scope of the present disclosure is not limited thereto. Any change or replacement made by the skilled in the art without departing from the technical scope of the present disclosure shall fall within the protection scope of the present disclosure. Hence, the protection scope of the present disclosure shall be defined by the list of claims.

What is claimed is:

1. A vacuum adsorbing workbench, comprising a workbench body, a first suction tube and a first occluder, wherein the workbench body is provided with a plurality of first suction holes arranged in a first row; and
wherein each of the plurality of first suction holes is in communication with the first suction tube, and the first occluder is configured to be connected with the first suction tube cooperatively to cut off communication between each of the plurality of first suction holes and the first suction tube;
wherein an air outlet is located at a first end of the first suction tube and an opening is located at a second end of the first suction tube, the air outlet is in communication with a vacuumizing device, and the first occluder is configured to be inserted into the first suction tube via the opening; and
wherein the first occluder is fixedly connected with a position limiting piece, and the position limiting piece is configured to abut against an edge of a to-be-adsorbed object placed on the workbench body to limit an occluding position of the first occluder.

2. The vacuum adsorbing workbench according to claim 1, further comprising:
additional first suction tubes;
additional occulders;
additional rows of suction holes;
wherein the suction holes in a same one of the said additional rows are in communication with each other via a respective one of said additional suction tubes, and the suction holes in different rows are not in communication with each other;
wherein the number of additional suction tubes and additional occluders corresponds to the number of additional rows of suction holes; and
wherein each of said additional occluders is configured to be cooperatively connected with a respective one of said additional first suction tubes, in a corresponding one of said additional rows of suction holes.

3. The vacuum adsorbing workbench according to claim 2, wherein each of the first suction tube and the additional suction tubes is provided with a plurality of air inlets at a respective tube wall, and each of the air inlets of the plurality of air inlets is in communication with a corresponding one of the suction holes.

4. The vacuum adsorbing workbench according to claim 3, wherein an extending direction of the first suction tubes is in parallel with a row direction of the suction holes; and wherein each of the occluders is an occluding rod, a lengthwise direction of the occluding rod is in parallel with the extending direction of the first suction tubes and the occluding rod is configured to slide inside a respective one of said first suction tubes to cut off communication between a desired amount of suction holes, in the corresponding row, and the respective first suction tube.

5. The vacuum adsorbing workbench according to claim 4, wherein the position limiting piece is in parallel with the occluding rod of the first occluder, and the position limiting piece and the first occluder have a same length.

6. The vacuum adsorbing workbench according to claim 4, wherein a sealing ring is sleeved on an end of the occluding rod cooperating with the first suction tube.

7. The vacuum adsorbing workbench according to claim 4, further comprising a second suction tube, wherein the second suction tube is in communication with the vacuumizing device and the air outlets of the first suction tubes are in communication with the second suction tube, to enable the vacuumizing device to be in communication with the first suction tubes.

8. The vacuum adsorbing workbench according to claim 7, wherein the occluding rod is of a hollow structure and is in communication with the second suction tube.

9. The vacuum adsorbing workbench according to claim 3, wherein a respective first suction tube of said first suction tube and said additional suction tubes is arranged in the workbench body and located below a respective one of said rows of suction holes, and the opening is located at a lateral side of the workbench body perpendicular to the row direction of the suction holes.

10. The vacuum adsorbing workbench according to claim 1, wherein the position limiting piece is a position limiting rod, an upper surface of the workbench body is provided with a plurality of guiding grooves, each of the plurality of guiding grooves is located between two adjacent rows of suction holes, and the position limiting rod is configured to move along an extending direction of one of the plurality of guiding grooves.

11. The vacuum adsorbing workbench according to claim 1, further comprising a fixation plate, wherein the position limiting piece and the occluder are connected with the fixation plate fixedly.

12. A vacuum adsorbing device, comprising a vacuum adsorbing workbench and a vacuumizing device, wherein the vacuum adsorbing workbench comprises a workbench body, a first suction tube and a first occluder, wherein the workbench body is provided with a plurality of first suction holes arranged in a first row:
wherein each of the plurality of first suction holes is in communication with the first suction tube, and the first occluder is configured to be connected with the first suction tube cooperatively to cut off communication between each of the plurality of first suction holes and the first suction tube; wherein the vacuumizing device is in communication with a second suction tube of the vacuum adsorbing workbench and is configured to vacuumize air in the second suction tube to enable a to-be-adsorbed object to be fixed onto the vacuum adsorbing workbench; wherein an air outlet is located at a first end of the first suction tube and an opening is located at a second end of the first suction tube, the air outlet is in communication with a vacuumizing device, and the first occluder is configured to be inserted into the first suction tube via the opening; and wherein the first occluder is fixedly connected with a position limiting piece, and the position limiting piece is configured to abut against an edge of a to-be-adsorbed object placed on the workbench body to limit an occluding position of the first occluder.

13. The vacuum adsorbing device according to claim 12, further comprising:
additional first suction tubes;
additional occulders;
additional rows of suction holes;
wherein the suction holes in a same one of the said additional rows are in communication with each other via a respective one of said additional suction tubes, and the suction holes in different rows are not in communication with each other;
wherein the number of additional suction tubes and additional occluders corresponds to the number of additional rows of suction holes; and wherein each of said additional occulders is configured to be cooperatively connected with a respective one of said additional first suction tubes, in a corresponding one of said additional rows of suction holes.

14. The vacuum adsorbing device according to claim 13, wherein each one of said first suction tube is provided with a plurality of air inlets at a tube wall of a respective first suction tube, and the plurality of air inlets is in communication with the first suction holes respectively.

15. The vacuum adsorbing device according to claim 14, wherein an extending direction of the first suction tube is in parallel with a row direction of the suction holes; and wherein the occluder is an occluding rod, a lengthwise direction of the occluding rod is in parallel with the extending direction of the first suction tube, and the occluding rod is configured to slide inside the first suction tube to cut off communication between a desired amount of suction holes, in the corresponding row, and the respective first suction tube.

16. The vacuum adsorbing device according to claim 14, wherein the vacuum adsorbing workbench further comprises a second suction tube, wherein the second suction tube is in communication with the vacuumizing device and the air outlets of the first suction tube are in communication with the second suction tube, to enable the vacuumizing device to be in communication with the first suction tubes.

17. The vacuum adsorbing device according to claim 16, wherein the occluding rod is of a hollow structure and is in communication with the second suction tube.

18. The vacuum adsorbing device according to claim 12, wherein the position limiting piece is a position limiting rod, an upper surface of the workbench body is provided with a plurality of guiding grooves, each of the guiding grooves is located between two adjacent rows of suction holes, and the position limiting rod is configured to move along an extending direction of one of the guiding grooves.

19. A vacuum adsorbing workbench, comprising a workbench body, a first suction tube and a first occluder, wherein the workbench body is provided with a plurality of first suction holes arranged in a first row; and wherein each of the plurality of first suction holes is in communication with the first suction tube, and the first occluder is configured to be connected with the first suction tube cooperatively to cut off communication between each of the plurality of first suction holes and the first suction tube;

wherein an air outlet is located at a first end of the first suction tube and an opening is located at a second end of the first suction tube, the air outlet is in communication with a vacuumizing device, and the first occluder is configured to be inserted into the first suction tube via the opening; wherein the first occluder is fixedly connected with a position limiting piece, and the position limiting piece is configured to abut against an edge of a to-be-adsorbed object placed on the workbench body to limit an occluding position of the first occluder; and wherein the position limiting piece is a position limiting rod, an upper surface of the workbench body is provided with a plurality of guiding grooves, each of the plurality of guiding grooves is located between two adjacent rows of suction holes, and the position limiting rod is configured to move along an extending direction of a guiding grove of the plurality of guiding grooves.

20. The vacuum adsorbing workbench according to claim 19, further comprising:

additional first suction tubes;

additional occulders;

additional rows of suction holes;

wherein the suction holes in a same one of the said additional rows are in communication with each other via a respective one of said additional suction tubes, and the suction holes in different rows are not in communication with each other;

wherein the number of additional suction tubes and additional occluders corresponds to the number of additional rows of suction holes; and wherein each of said additional occluders is configured to be cooperatively connected with a respective one of said additional first suction tubes, in a corresponding one of said additional rows of suction holes.

* * * * *